(12) United States Patent
Kaiser et al.

(10) Patent No.: US 6,441,677 B1
(45) Date of Patent: Aug. 27, 2002

(54) INTEGRATED SEMICONDUCTOR CIRCUIT WITH AN INCREASED OPERATING VOLTAGE

(75) Inventors: Robert Kaiser, Kaufering; Florian Schamberger, Bad Reichenhall; Helmut Schneider, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/621,430

(22) Filed: Jul. 21, 2000

(30) Foreign Application Priority Data

Jul. 21, 1999 (DE) .......................... 199 34 297

(51) Int. Cl.[7] .............................. H03K 1/10
(52) U.S. Cl. ........................ 327/534; 327/53
(58) Field of Search .................. 327/52, 53, 63, 327/65, 66, 72, 77, 534, 535, 537

(56) References Cited

U.S. PATENT DOCUMENTS

| | | | | |
|---|---|---|---|---|
| 5,689,209 A | * | 11/1997 | Williams et al. ............ 327/425 |
| 5,854,569 A | * | 12/1998 | Kohno et al. ................ 327/543 |
| 6,046,622 A | * | 4/2000 | Miles ........................... 327/427 |
| 6,104,214 A | * | 8/2000 | Ueda et al. .................. 326/115 |
| 6,118,328 A | * | 9/2000 | Morikawa .................... 327/534 |
| 6,218,892 B1 | * | 4/2001 | Soumyanath et al. ........ 327/537 |

FOREIGN PATENT DOCUMENTS

| DE | 19827938 A1 | 4/1999 |
|---|---|---|
| DE | 19808525 A1 | 9/1999 |

* cited by examiner

Primary Examiner—Terry D. Cunningham
Assistant Examiner—Quan Tra
(74) Attorney, Agent, or Firm—Laurence A. Greenberg; Werner H. Stemer; Ralph E. Locher

(57) ABSTRACT

An integrated semiconductor circuit has a transistor of the NMOS type that is disposed in a well of a p conductivity type in a substrate of the p conductivity type. The well is electrically insulated from the substrate. The semiconductor circuit furthermore contains a control circuit with a variable output signal. The well terminal of the transistor is connected to the output signal of the control circuit. The transistor is protected against permanent damage by virtue of its well potential being raised in a corresponding operating mode of the semiconductor circuit in which an increased operating voltage is applied to the transistor.

4 Claims, 3 Drawing Sheets

US 6,441,677 B1

INTEGRATED SEMICONDUCTOR CIRCUIT WITH AN INCREASED OPERATING VOLTAGE

BACKGROUND OF THE INVENTION

Field of the Invention

The present invention relates to an integrated semiconductor circuit having NMOS transistors which are at an increased operating voltage in a corresponding operating mode.

Integrated semiconductor circuits often have programmable elements for permanently storing data. In the case of integrated memory circuits, these may be in particular, electrically programmable elements which, by way of example, serve for storing repair information with regard to repairing defective memory cells. The programmable elements can be programmed at the end of the process for fabricating the integrated circuit by an application of a so-called burning voltage.

For the purpose of programming the electrically programmable elements, a burning voltage having a high potential level is applied to the circuit in a corresponding operating mode, for example externally or internally by an additional circuit. The operation for programming the programmable elements is in this case effected by a high voltage or a high current, which leads to permanent alteration of the conductor track resistance, for example causing a corresponding electrical fuse to melt or an insulator to break down (so-called anti-fuse).

As a result of the burning voltage being applied to a circuit for programming a programmable element, high potential differences occur across the circuit and, in some instances, across other circuits connected thereto. In order to withstand the potential differences, which are considerably increased in comparison with unaffected circuit sections of the integrated circuit, it is necessary for those circuit elements of the relevant circuit which are at the increased voltage to be given adequate dimensions. With the application of recent technologies with decreasing feature sizes and smaller gate oxide thicknesses, it is generally no longer possible to configure the affected circuit elements such that they can withstand the increased potential difference.

Integrated semiconductor circuits often contain transistors using NMOS technology. NMOS transistors are usually made in a substrate with a base doping of a p-conductivity type. Accordingly, it contains zones with drain terminals and source terminals with a respective doping of an n-conductivity type and also a channel with a gate terminal. Situated in the substrate beneath the channel there is often a fourth terminal of the transistor, which is also referred to as a bulk terminal. The substrate in which the NMOS transistor is made is usually connected to a fixed reference-ground potential of the integrated circuit. If the transistor is not electrically insulated from the rest of the substrate of the integrated circuit, its bulk terminal is, accordingly, likewise at the reference-ground potential. If, for example, the burning voltage mentioned above is applied to one of the other 10 terminals of the transistor, the transistor may incur permanent damage on account of the increased potential difference between the corresponding terminal of the transistor and the bulk terminal thereof. The semiconductor circuit generally manifests a functional error as a consequence.

SUMMARY OF THE INVENTION

It is accordingly an object of the invention to provide an integrated semiconductor circuit with an increased operating voltage that overcomes the above-mentioned disadvantages of the prior art devices of this general type, which contains a transistor of the NMOS type and protects against damage, the transistor which is at an increased input voltage or supply voltage in a corresponding operating mode.

With the foregoing and other objects in view there is provided, in accordance with the invention, an integrated semiconductor circuit containing a substrate of a p-conductivity type. A well of the p-conductivity type is disposed in the substrate and electrically insulated from the substrate, and the well also has a well terminal. An NMOS transistor is disposed in the well. A control circuit having a terminal for an output signal whose potential can be altered by the control circuit is provided. The terminal for the output signal is connected to the well terminal.

The integrated semiconductor circuit has a transistor of the NMOS type that is disposed in the well of the p-conductivity type, which well, for its part, is disposed in the substrate of the p-conductivity type. The well is electrically insulated from the substrate, this being achieved during fabrication for example by a so-called buried well process. The semiconductor circuit furthermore has a control circuit with an output signal whose potential can be altered by the control circuit. A well terminal of the well is connected to the output signal of the control circuit. The well terminal forms the bulk terminal of the transistor. The provision of the control circuit thus makes it possible to influence the potential of the well (bulk potential) in such a way that the potential difference between the well and the remaining terminals of the transistor is small enough to protect the transistor against damage.

As a result of the deliberate intervention in the bulk potential of transistors, there is no need for any additional individual protective circuits for each transistor or additional process steps which additionally increase the outlay for fabricating an integrated semiconductor circuit. Furthermore, it is possible, within an integrated semiconductor circuit, to operate different circuit regions with a different reference-ground potential and a different operating voltage. The potentials of the different circuit regions are completely decoupled from one another. By deliberately influencing the potential difference between the bulk terminal and the remaining terminals of a transistor, it is possible, moreover, to use, even in the circuit regions which are at a higher operating voltage, the circuit elements of the same type which are employed in the remaining circuit regions. This simplifies the configuration and construction process for an integrated circuit.

In a refinement of the invention, the semiconductor circuit has a first operating mode and a second operating mode. In the first operating mode, a first potential of an operating voltage is applied and the output signal of the control circuit has a first reference-ground potential. In the second operating mode, a second potential of an operating voltage is applied, the second potential being higher than the first potential, and the output signal of the control circuit has a second reference-ground potential, which is higher than the first reference-ground potential. Thus, by way of example, if a burning voltage for programming an electrical fuse is applied to the semiconductor circuit in the second operating mode, by virtue of the bulk potential of the NMOS transistor being raised to a suitable extent during the burning operation, the control circuit prevents an excessively high potential difference from occurring across the transistor.

In a development of the invention, the semiconductor circuit or circuit sections thereof can be operated in its or their intended function exclusively in the first operating mode. It contains a differential amplifier, for example. The various configurations of differential amplifiers have, in principle, the same basic circuit of the known type. This contains two input transistors, a current source and an active or passive load. A potential difference between the input signals present at the two input transistors brings about a change in potential at an output of the differential amplifier. The input transistors are embodied using NMOS technology. In comparison with PMOS transistors, these generally have a higher gain and require less space. If an increased input signal or potential of an operating voltage compared with the first operating mode is applied to the control terminal of one of the input transistors in the second operating mode, an increased potential difference between the control terminal and the bulk terminal of the transistor is reduced by the output signal of the control circuit.

Furthermore, an increased potential difference occurs between the control terminal of the transistor and the circuit node at which the input transistors are connected to the current source. In order to reduce this potential difference as well, the current source is switched off in the second operating mode and the circuit node is connected to the output signal of the control circuit.

The advantage of protection realized in such a way is that there is no need for a further protective circuit for protecting the input transistor. The further protective circuit for example having an ESD-like structure and thus constituting a low-resistance protection. In this embodiment, the input resistance of the differential amplifier remains at a high value, and so the power loss remains low.

In a further development, the semiconductor circuit or circuit sections thereof can be operated in its or their intended function in both operating modes. It has, by way of example, an inverter stage having a switching transistor of the NMOS type whose bulk terminal and source terminal are connected to one another. As a result, both the bulk potential and the source potential are raised to a suitable extent by the control circuit in the second operating mode. In order to ensure the intended function of the inverter stage in the second operating mode as well, the semiconductor circuit has a further control circuit, e.g. embodied as a so-called level shifter, which correspondingly raises a signal level of an applied input signal. The output signal of the further control circuit that can thus be picked off is connected to an input signal of the inverter stage. As a result, in addition to the supply potential and the reference-ground potential of the inverter stage, the signal level of the input signal of the inverter stage is also raised correspondingly. The relative potential differences in accordance with the first operating mode, which corresponds to normal operation for example, are thereby preserved.

With the foregoing and other objects in view there is further provided, in accordance with the invention, an integrated semiconductor circuit containing a substrate of the p-conductivity type. Wells of the p-conductivity type are disposed in the substrate and electrically insulated from the substrate, and the wells each have a well terminal. A control circuit having a terminal for an output signal whose potential can be altered by the control circuit is further provided.

The terminal for the output signal is connected to the well terminal. A differential amplifier is provided which has two NMOS input transistors disposed in the wells and connected to each other. A current source is connected to the two NMOS input transistors and defines a circuit node at a connection point between the two NMOS input transistors and the current source. The circuit node is connected to the terminal for the output signal of the control circuit in the second operating mode, and the current source is switched off in the second operating mode. The differential amplifier further has a load element connected to the two input transistors. A first potential of an operating voltage is applied to one of the two input transistors in a first operating mode. A second potential of the operating voltage is applied to the one of the two input transistors in a second operating mode, the second potential being higher than the first potential. The output signal of the control circuit has a first reference-ground potential in the first operating mode, and the output signal of the control circuit has a second reference-ground potential in the second operating mode, the second reference-ground potential being higher than the first reference-ground potential.

With the foregoing and other objects in view there is also provided, in accordance with the invention, an integrated semiconductor circuit containing a substrate of a p-conductivity type. A well of the p-conductivity type is disposed in the substrate and electrically insulated from the substrate and the well has a well terminal. An inverter stage having an input terminal for an input signal and at least one NMOS switching transistor is disposed in the well. The NMOS switching transistor has a source terminal that is connected to the well terminal. A first control circuit having a terminal for an output signal whose potential can be altered by the control circuit is provided. The terminal for the output signal is connected to the well terminal. A second control circuit having a terminal for an input signal and a terminal for an output signal is provided. The second control circuit raises a potential of the input signal in the second operating mode, which, in a raised state, can be picked off at the terminal for the output signal of the second control circuit. The input terminal for the input signal of the inverter stage is connected to the terminal for the output signal of the second control circuit. A first potential of an operating voltage is applied to the semiconductor circuit in a first operating mode. A second potential of the operating voltage is applied to the semiconductor circuit in a second operating mode, the second potential being higher than the first potential. The output signal of the first control circuit has a first reference-ground potential in the first operating mode, and the output signal of the first control circuit has a second reference-ground potential in the second operating mode, the second reference-ground potential being higher than the first reference-ground potential.

Other features which are considered as characteristic for the invention are set forth in the appended claims.

Although the invention is illustrated and described herein as embodied in an integrated semiconductor circuit with an increased operating voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
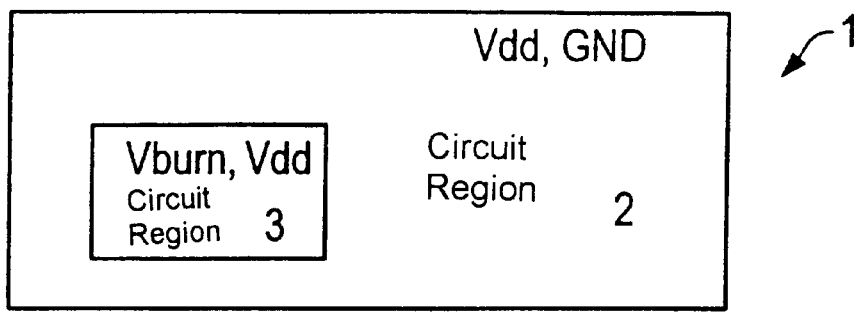
FIG. 1 is a block diagram of a semiconductor circuit with diagrammatically illustrated circuit regions having different operating voltages according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor circuit 1 having various circuit regions 2, 3 having different operating voltages. By way of example, circuits or circuit elements of the circuit region 2 can be operated with a positive supply potential Vdd and a reference-ground potential GND. The circuit region 3, which is electrically insulated from the circuit region 2, can be operated with an increased operating voltage, for example a burning voltage Vburn, and a reference-ground potential Vdd.

The invention enables the circuit regions 2 and 3 to be operated in a manner decoupled from one another. By way of example, if the operating voltages of the region 2 are applied to the semiconductor circuit in a corresponding operating mode, the region 2 is operated, while the region 3 is switched off. If the operating voltages of the region 3 are applied in another operating mode, for example, operation the other way round can be implemented. However, it is also conceivable to operate the region 2 and/or 3 in both operating modes.

Figure 2:
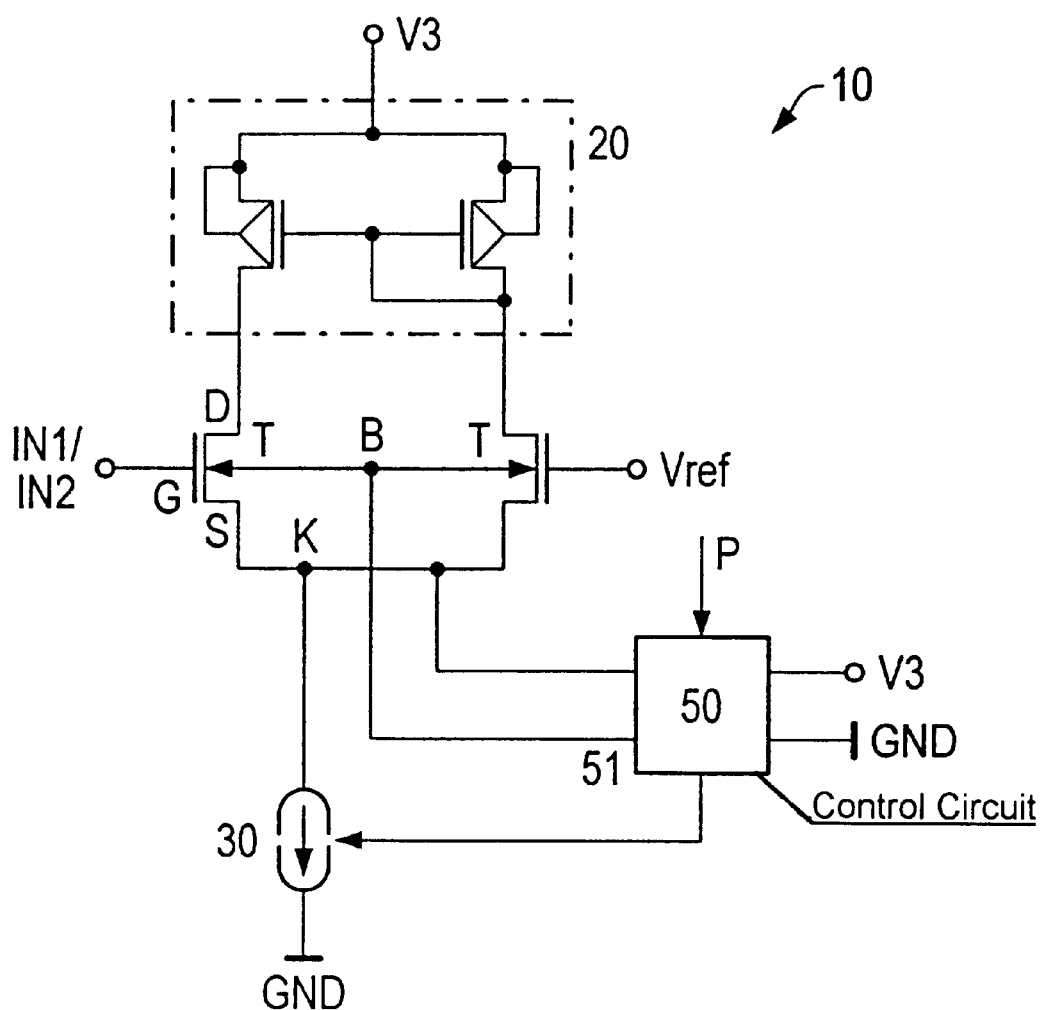
FIG. 2 is a circuit diagram of a basic circuit of a differential amplifier having a control circuit for raising a bulk potential of a transistor.

FIG. 2 reveals an embodiment of a basic circuit of a differential amplifier 10, which contains input transistors T and also a current source 30 and a load element 20 in a form of a current mirror 30. The differential amplifier 10 is connected by the load element 20 to a potential V3, which, for example, corresponds to an internal supply potential Vint, and is connected through the current source 30 to a reference-ground potential GND of the integrated circuit. An input signal IN1/IN2 of the differential amplifier 10 is applied to a gate terminal G of one of the input transistors T. A reference potential Vref, for example, is applied to a gate terminal of the other input transistor T. A control circuit 50, which is controlled by a signal P, has a terminal for an output signal 51, which is connected to bulk terminals B of the transistors T.

In a first operating mode (input signal IN1), which, for example, corresponds to a normal operation of the integrated circuit, the output signal 51 of the control circuit 50 has the reference-ground potential GND. In a second operating mode, which, for example, corresponds to a burning operation of an electrical fuse to be programmed, an increased input signal IN2 compared with the first operating mode is applied to the gate terminal G of the input transistor T. In order to prevent an increased potential difference between the gate terminal G and the bulk terminal B of the transistor T, the output signal 51 of the control circuit 50 has the reference-ground potential V3 in the second operating mode. The reference-ground potential likewise being increased compared with the reference-ground potential GND. The current source 30 is switched off in the second operating mode, for example under the control of the control circuit 50. In order, moreover, to prevent an increased potential difference between the gate terminal G and a source terminal S of the transistor T, a circuit node K is connected to the output signal 51 of the control circuit 50 in the second operating mode. This is done by suitable circuitry in the control circuit 50. The differential amplifier 10 is switched off in the second operating mode.

Figure 3:
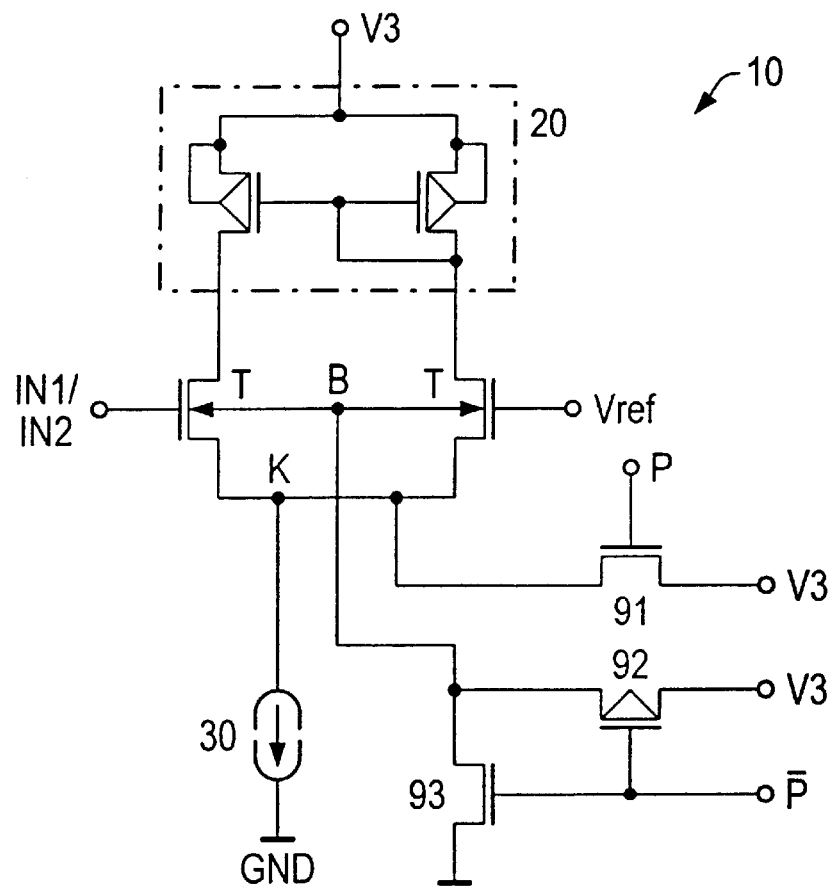
FIG. 3 is a circuit diagram of a more detailed configuration of the basic circuit of the differential amplifier shown in FIG. 2.

FIG. 3 shows a more detailed embodiment of FIG. 2. Via transistors 91, 92 and 93, which are controlled by signals P and P, respectively, the bulk terminals B of the transistors T and the node K, respectively, have the corresponding potentials GND and V3, respectively, applied to them.

Figure 4:
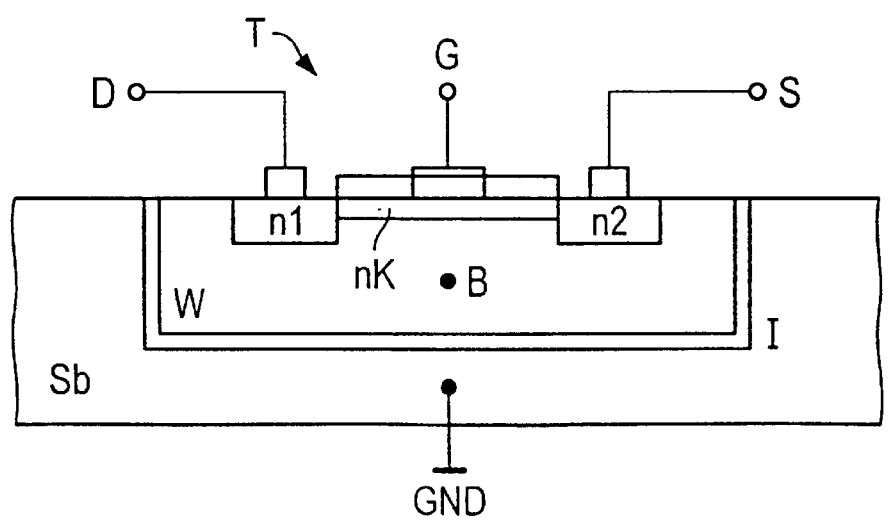
FIG. 4 is a cross-sectional view of an NMOS transistor that is used.

FIG. 4 shows a cross section of the transistor T used in FIG. 2 and FIG. 3. FIG. 4 illustrates a transistor of the NMOS type that is disposed in a well W of the p-conductivity type, which, for its part, is disposed in a substrate Sb. The well W is electrically insulated from the substrate Sb by an insulation layer I. Zones n1 and n2 are connected to a drain terminal D and to a source terminal S, respectively, of the transistor. A gate terminal G is applied above a channel nk. The zones n1 and n2 are of the n-conductivity type. The channel nk forms an inversion layer. The substrate Sb, which is of the p-conductivity type, is connected to the fixed reference-ground potential GND of the integrated circuit. The insulation layer I makes it possible to isolate a well terminal B (bulk terminal of the NMOS transistor) within the well W from the substrate terminal of the substrate Sb.

Figure 5:
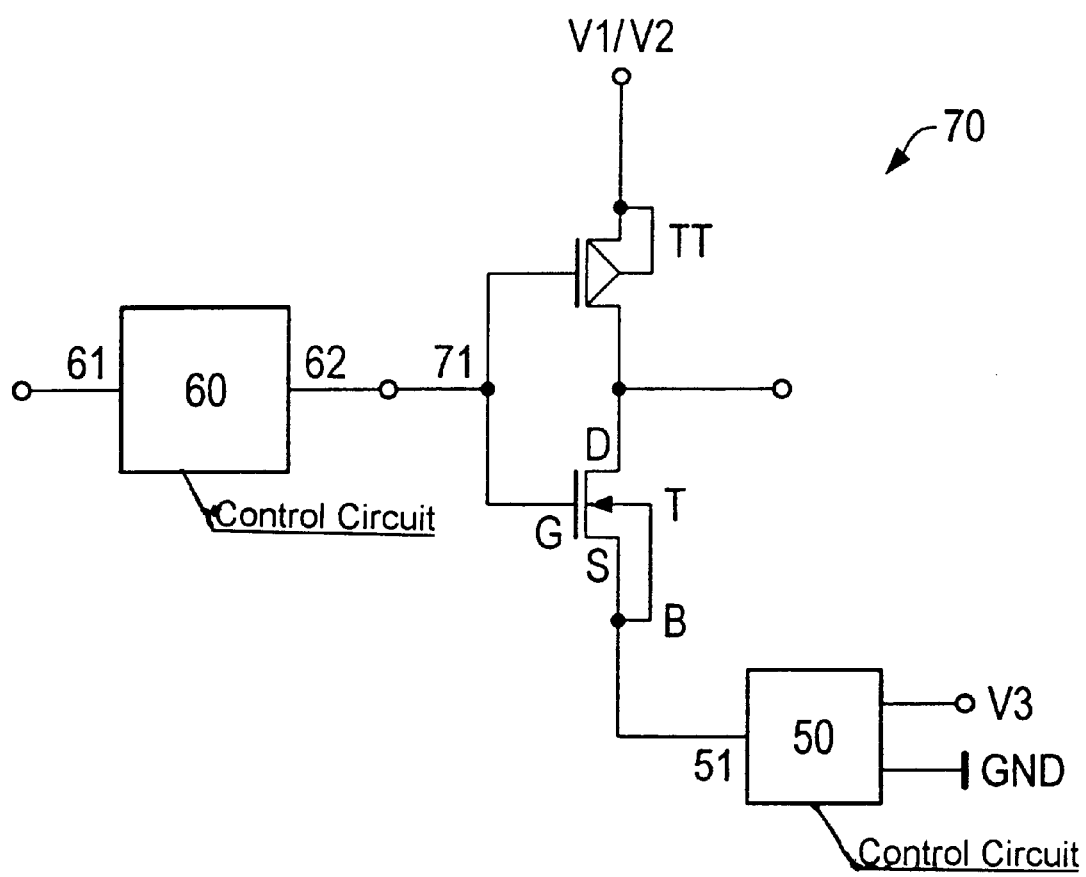
FIG. 5 is a block circuit diagram of an inverter stage of a CMOS type with a further control circuit.

FIG. 5 shows an inverter 70 containing the switching transistors T and TT. The bulk terminal B of the NMOS transistor T is connected to the source terminal S thereof. As a result, both terminals are connected to the control circuit 50. In both operating modes, the inverter 70 can be operated with a supply voltage V1 and/or an increased supply voltage V2 by comparison with the latter. In order to raise the signal level of the input signal 71 of the inverter stage 70 to a suitable extent, a further control circuit 60 is provided, which correspondingly raises a potential of an input signal 61 which can be picked off at a terminal for an output signal 62. The output signal 62 is connected to the input signal 71 of the inverter stage 70.

We claim:

1. An integrated semiconductor circuit, comprising:

a substrate of a p-conductivity type;

a well of the p-conductivity type disposed in said substrate and electrically insulated from said substrate, said well having a well terminal;

a first NMOS input transistor disposed in said well;

a control circuit having a terminal for an output signal whose potential can be altered by said control circuit, said terminal for the output signal connected to said well terminal;

a first potential of an operating voltage being applied to the semiconductor circuit in a first operating mode;

a second potential of the operating voltage being applied to the semiconductor circuit in a second operating mode, the second potential being higher than the first potential;

the output signal of said control circuit having a first reference-ground potential in the first operating mode;

the output signal of said control circuit having a second reference-ground potential in the second operating mode, the second reference-ground potential being higher than the first reference-ground potential;

the semiconductor circuit being operable for its intended function exclusively in the first operating mode; and a differential amplifier having:
- a second NMOS input transistor connected to said first input NMOS transistor;
- a current source connected to said first and second NMOS input transistors and defining a circuit node at a connection point between said first and second NMOS input transistors and said current source, said circuit node connected to said terminal for the output signal of said control circuit in the second operating node, said current source being switched off in the second operating node; and
- a load element connected to said first and second NMOS input transistors.

2. The integrated semiconductor circuit according to claim 1, wherein the semiconductor circuit can be operated for its intended function in both the first operating mode and the second operating mode.

3. The integrated semiconductor circuit according to claim 1, including circuit sections that can be operated in their intended function exclusively in the first operating mode.

4. The integrated semiconductor circuit according to claim 1, including circuit sections that can be operated in their intended function in both the first operating mode and the second operating mode.

* * * * *